United States Patent [19]

Koury, Jr. et al.

[11] Patent Number: 4,675,554
[45] Date of Patent: Jun. 23, 1987

[54] NPN TRANSIENT DRIVER CIRCUIT

[75] Inventors: Daniel N. Koury, Jr., Scottsdale; Walter C. Seelbach, Fountain Hills, both of Ariz.

[73] Assignee: Motorola, Inc., Schaumburg, Ill.

[21] Appl. No.: 815,846

[22] Filed: Jan. 3, 1986

[51] Int. Cl.[4] .................. H03K 19/086; H03K 17/16; H03K 19/02; H03K 17/60

[52] U.S. Cl. ................................. 307/455; 307/443; 307/446; 307/254; 307/270; 307/280; 307/300; 307/544; 307/560

[58] Field of Search ............... 307/443, 446, 455, 300, 307/544, 560, 254, 280, 270, 296, 262

[56] References Cited

U.S. PATENT DOCUMENTS 3,522,446  8/1970  Kodama ........................... 307/455
4,533,842  8/1985  Yang et al. ....................... 307/446

OTHER PUBLICATIONS

Montegari, "Push-Pull Driver", I.B.M. Tech. Dis. Bull.

Primary Examiner—Stanley D. Miller
Assistant Examiner—M. R. Wambach
Attorney, Agent, or Firm—Michael D. Bingham

[57] ABSTRACT

A transient driver circuit for use with a logic circuit having an emitter-follower output stage that sources current to a load connected to an output thereof in response to an applied logic signal being at a first logic level. The transient driver circuit includes a first NPN transistor the collector-emitter path of which is coupled between the output of the logic circuit and the negative power supply rail, a second NPN transistor having its collector-emitter path couple between a positive power supply rail and the collector of the first NPN transistor and its base adapted to receive the logic signal and feedback circuitry that is responsive to a rise in the collector voltage of the second NPN transistor occurring as the logic signal switches to a second logic level for supplying current drive to the base of the first NPN transistor thereby turning it on to sink a large transient current at the output of the logic circuit.

20 Claims, 4 Drawing Figures

NPN TRANSIENT DRIVER CIRCUIT

BACKGROUND OF THE INVENTION

The present invention relates to bipolar logic circuits and, more particularly, to a transient driver circuit for use in conjunction with monolithic bipolar logic circuits which provides an output transient charge and discharge current path.

Historically, one of the most important advantages of bipolar transistor technology has been its ability to drive large resistive and capacitive loads with relatively small device geometries. For instance, a typical emitter coupled logic (ECL) gate comprises an emitter coupled logic stage coupled to a transistor emitter-follower output stage which restores DC levels. The emitter-follower output stage sources output current at the output of the ECL gate that is an exponential function of the emitter-base voltage of the output transistor. High fan-out operation is possible because of the high input impedance of the emitter coupled logic stage and the low output impedance of the emitter-follower output stage. To minimize quiescent power dissipation in the ECL gate, the emitter-follower output stage typically includes a resistor coupled between the output of the ECL gate and the negative power supply rail which sets the quiescent current in the emitter-follower output stage. A problem occurs when such prior art ECL gates are operated into large capacitive loads which must be discharged as the output of the gate switches from a first logic level to a second logic level. In prior art ECL gates the discharge current must flow through the resistor to the negative supply rail of the gate. Since the resistor is much larger in value than the "on" resistance of the emitter-follower transistor, discharge of the capacitor is much slower than the charge thereof since discharge is at a near constant rate determined by the resistor. Hence, the input logic signal aplied to the ECL gate is slewed, i.e., the resultant fall time of the output signal is different than the input signal. This is highly undesirable.

To decrease the discharge time the resistance value of the resistor coupled to the emitter follower stage of the ECL gate can be made smaller. However, this results in a undesirable increase in quiescent power dissipation since the quiescent current flowing through the emitter-follower output stage is increased. In order to be able to utilize bipolar ECL gates in complex logic circuits requires reducing the static power requirement of the ECL gate without sacrificing speed. In addition to the bipolar ECL gates must be able to provide transient source and sink currents such that large capacitive loads can be driven at high speed while at the same time minimizing the quiescent power dissipation of the ECL gates.

Hence, a need exists for a transient driver circuit for use in conjunction with bipolar logic circuits such as ECL gates which can quickly discharge as well as charge capacitive loads coupled to the output of logic circuits by providing a transient discharge current only during transient switching conditions.

SUMMARY OF THE INVENTION

Accordingly, it is an object of the present invention to provide an improved transient driver circuit.

It is another object of the present invention to provide an improved all NPN transistor transient driver circuit.

Still another object of the present invention is to provide an improved bipolar transient driver circuit.

Yet another object of the present invention is to provide an improved bipolar transient driver circuit suited to be utilized in conjunction with ECL gate circuits.

Still yet another object of the present invention is to provide an improved ECL gate having transient discharging current characteristics.

In accordance with the above and other objects, there is provided a transient driver circuit for use with a logic circuit having an input and an output comprising a first NPN transistor having its collector-emitter path coupled in series between the output of the circuit and a first power supply rail, a second NPN transistor having its collector-emitter path coupled in series between a second power supply rail and the collector of the first NPN transistor, and a feedback circuit responsive to a rise in the collector voltage of the second NPN transistor for rendering the first NPN transistor conductive by supplying base current drive thereto whereby a large transient current is sourced through the collector-emitter thereof, the base of the second NPN transistor being coupled to the input of the circuit.

DETAILED DESCRIPTION OF THE INVENTION

Figure 1:
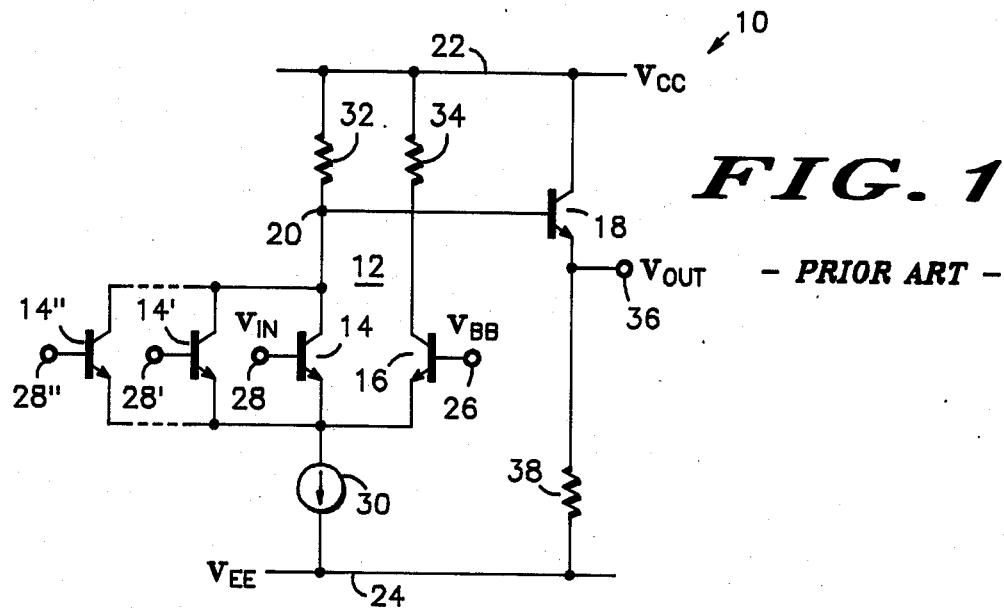
FIG. 1 is a schematic diagram illustrating a prior art ECL gate circuit.

Before describing the present invention, a prior art emitter-coupled-logic (ECL) gate 10 is described in reference to FIG. 1. ECL gate 10 is well known in the art and is suited to be manufactured in integrated circuit form using conventional bipolar process technology. ECL gate 10 comprises a emitter coupled input stage 12 including NPN transistors 14 and 16 and an emitter-follower output stage comprising NPN transistor 18 which is coupled to an output of emitter coupled logic input stage 12 at node 20. A voltage $V_{CC}$, which is applied to power supply conductor 22 is at ground reference while the voltage $V_{EE}$ applied to power supply conductor 24 is at a negative potential. One input 26, the base of transistor 16, to emitter coupled logic input stage 12 has a fixed bias, $V_{BB}$, applied thereto which is typically in the order of $-1.2$ volts. The other input 28, the base of transistor 14, has a logic input signal $V_{IN}$ applied thereto that switches between high and low level states. A constant current is sourced through emitter coupled logic input stage 12 via current source 30 which is coupled between the emitters of transistors 14 and 16 and power supply conductor 24. The collectors of transistor 14 and 16 are returned to power supply conductor 22 via respective resistors 32 and 34. Transistor 18 has its base coupled to node 20, its collector coupled to power supply conductor 22 and its emitter to output terminal 36 of ECL gate 10. A quiescent biasing resistor 38 is coupled between output 36 and power supply conductor 24. ECL gate 10 may also include multiple logic inputs 28' and 28" coupled respectively to the bases of transistors 14' and 14" the collectors and emitters of which are coupled between node 20 and current source 30. In this configuration ECL gate 10 functions as a NOR gate. It is recognized moreover that ECL gate 10 can function as a OR gate by having emitter coupled transistors coupled between the collector of transistor 16 and current source 30 similarly to transistors 14' and 14".

A logic input signal is applied at input 28 that typically switches between −1.6 volts and −0.8 volts corresponding to a logic "0" and a logic "1" respectively. Thus, in response to a logic "0" applied at input 28 of ECL gate 10, the current through current source 30 is supplied by transistor 16 while transistor's 14 conduction state is reduced. In this state the collector voltage of transistor 14 rises to $V_{CC}$ or 0 volts. An output voltage $V_{OUT}$ is thus produced at output 36 the magnitude of which is equal to a $V_{BE}$ voltage drop below ground, where $V_{BE}$ is the base to emitter voltage drop of transistor 18. Hence, $V_{OUT}$ is equal to approximately −0.8 volts. When a logic one input signal is applied to input 28 the current through current source 30 is supplied through transistor 14 as transistor 16 is rendered less conductive. In this logic state a voltage drop of approximately −0.8 volts is established across resistor 32. $V_{OUT}$ then drops to approximately −1.6 volts.

As previously mentioned a problem occurs when ECL gate 10 must drive a large capacitive load which would be connected to output 36. As the logic input signal switches negatively, to a logic zero, transistor 18 sources current at output 36 which will rapidly and exponentially charge the capacitive load such that there is minimum time delay between input and output switching. However, as the input signal switches to a high level state from the low state transistor 18 is turned off because the voltage drop across the capacitive load remains high which reverse biases the base-to-emitter junction of the transistor. Transistor 18 remains off until the capacitive load is discharged to a low level through resistor 38. The relative slow and constant discharge of the capacitor through resistor 38 produces an undesirable time delay or slew in the output pulse switching. This switching delay can be reduced by reducing the size of resistor 38 at the expense of increasing the quiescent current therethrough which, in turn, increases the power dissipation in ECL gate 10. This increased power dissipated is not desirable and, further, may not be permitted in large complex integrated circuits that require multiple ECL gates.

Figure 2:
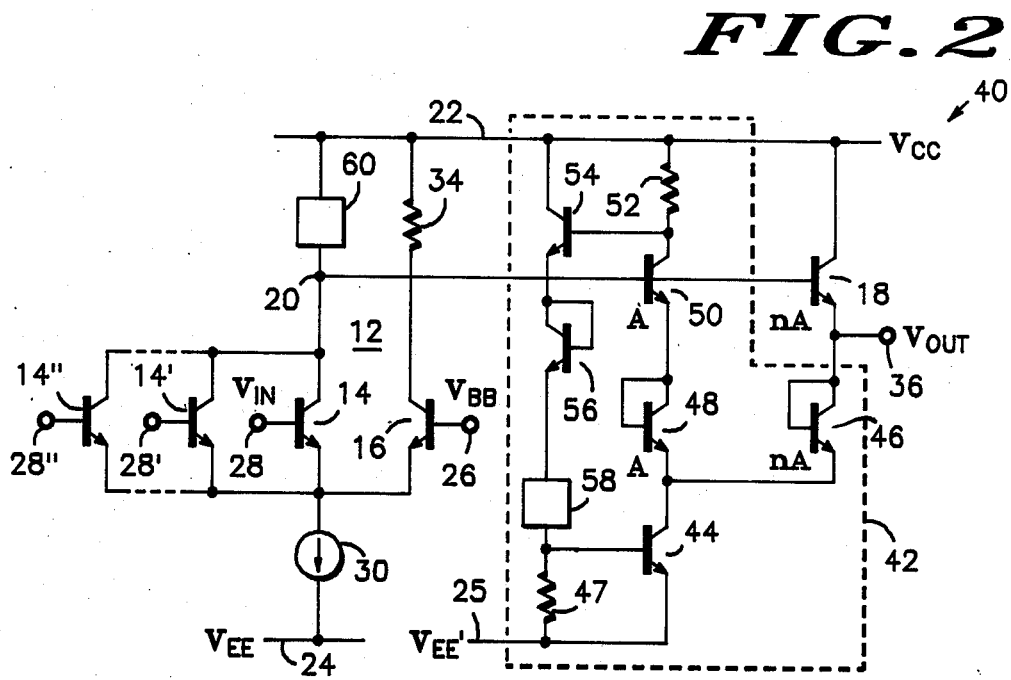
FIG. 2 is a partial block and schematic diagram illustrating an ECL gate in conjunction with a first embodiment of the present invention.

Turning to FIG. 2 there is shown emitter coupled logic circuit 40 which comprises conventional ECL gate 10 in conjunction with transient driver circuit 42 of the present invention. It is to be understood that components in the remaining FIGS. which correspond to like components in FIG. 1 are designated by the same reference numerals. Transient driver circuit 42 is illustrated as including a first NPN transistor 44 which has its collector-emitter path connected in series via diode-connected transistor 46 between output terminal 36 and negative power supply rail 25 at which is supplied $V_{EE}$. A second diode-connected transistor 48 is coupled between the collector of transistor 44 and the emitter of a second NPN transistor 50. The collector of transistor 50 is coupled via resistor 52 to positive supply rail 22. The base of transistor 50 is connected to input circuit node 20 and to the base of output transistor 18 of ECL gate 40. A third NPN transistor 54 has its base connected to the collector of transistor 50 and its collector-emitter path connected in series between positive power supply rail 22 and diode connected transistor 56. A voltage level shifting circuit 58 is connected in series between diode-connected transistor 56 and the base of transistor 44. A bias resistor 47 is connected between the base of transistor 44 and negative power supply conductor 25. Transistor 54, diode 56, and circuit 58 provide a feedback path during transient switching conditions to render transistor 44 conductive to provide a large transient current therethrough as will be more fully explained hereinafter.

Transient driver circuit 42 reduces the quiescent power dissipation of ECL gate 40 while increasing the switching speed by providing transient discharge of the capacitive load connected to output 36 whenever emitter follower output stage transistor 18 is turned off. Hence, a minimum quiescent current, as described above, can be maintained through the ECL gate 40 with faster switching times being obtained or the switching speed of the gate can be maintained while a lower quiescent current is established.

In a quiescent operating state the base of transistor 50 is substantially at the potential $V_{CC}$ whereby a current I flows therethrough; the value of which is set by the value of $V_{out}$, since current I is mirrored from transistor 18. This assumes that transistor 18 and transistor 50 have equal emitter areas. In general, however, as illustrated in FIG. 2 the area of transistor 18 may be made n times larger or smaller than the area A of transistor 50, where n is a positive number. Thus, a quiescent current equal to (n+1) I flows through transistor 44. In particular, with n equal to 1, the quiescent current through transistor 44 is set at 2I. The base-emitter voltage drop of transistor 44 is applied across resistor 47 and sets the quiescent value of the current supplied through transistor 54. Hence, the total quiescent current flow through transient driver circuit 42 is equal to:

$$I_Q = (n+1)I + I_{R47}: \text{ with } n=1 \quad (1)$$

$$I_Q = 2I + I_{R47} \quad (2)$$

This quiescent current can be set to the same quiescent current value maintained in ECL gate 10 of FIG. 1 as previously described.

In operation, with ECL gate 10 wired as a NOR logic gate, the logic input signal applied at input 28 is inverted and appears at node 20. the logic signal at node 20 varies from a high level state equal to $V_{CC}$ to a low level state having a value equal to $-V_{60}$, the voltage drop developed across circuit 60. As transistor 14 is rendered non-conductive by the logic input signal, transistor 18 is rendered more conductive to source current to output 36, to charge a capacitive load, for example. $V_{OUT}$ is therefore equal to ($V_{CC} - V_{BE}$). As the voltage at node 20 switches negatively to a value equal to $-V_{60}$, both transistor 18 and transistor 50 are turned off for large capacitive loads connected to output 36. The voltage at the collector of transistor 50 will begin to rise. The feedback circuit including transistor 54 senses this rise in the collector voltage of transistor 50 and sources sufficient base drive to rapidly increase the conduction of transistor 44 thereby sinking a large transient current from ouput 36. Any capacitive load connected to output 36 will therefore be rapidly and exponentially discharged as transistor 44 is rendered more highly conductive. Therefore delay in the output switching signal is minimized over that of ECL gate 10 while power dissipation therein is reduced. It is noted that although transient driver circuit 42 has been described in conjunction with an ECL gate, it can also be utilized with other types of circuits.

It is necessary to prevent transistor 44 from becoming saturated in its transient "on" condition. During the time that transistor 44 is turned on hard and sinking a transient current, the voltage at the collector thereof is approximately equal to the value, $(V_{CC}-V_{60}-2V_{BE})$. By making the voltage drop cross circuit 58 equal to that of circuit 60, the voltage drop thereacross, $V_{58}$, is made equal to $V_{60}$. Hence, the voltage established at the base of transistor 44 is then equal to $(V_{CC}-V_{R52}-V_{58}-2V_{BE})$ which ensures that the collector base junction of transistor 44 is reversed biased to prevent it from becoming saturated.

Figure 3:
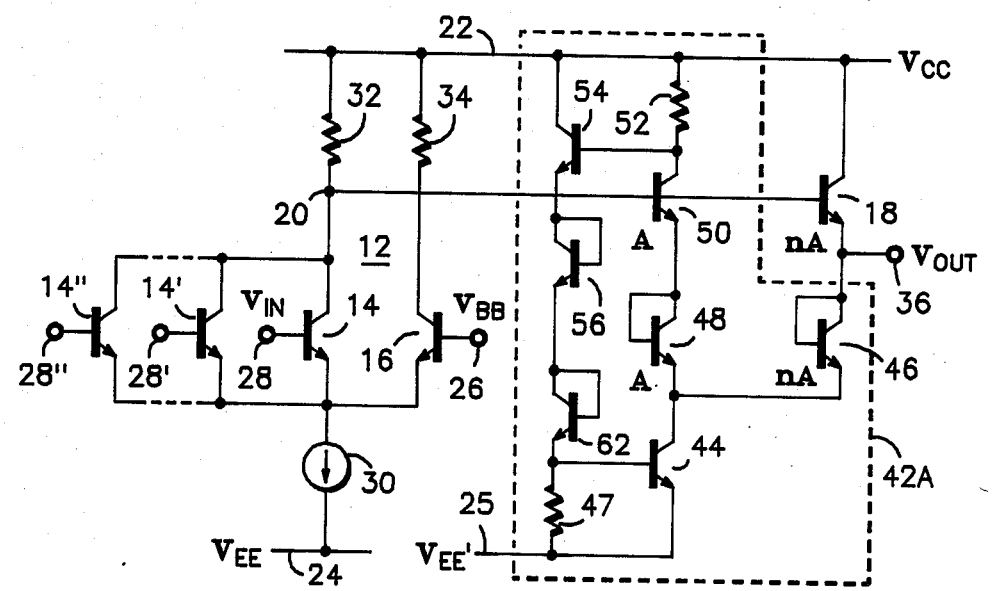
FIG. 3 is a schematic diagram of an ECL gate including the preferred embodiment of the present invention.

Referring to FIG. 3, transient driver circuit 42a is illustrated in combination with ECL gate 40. As shown, circuit 60 is realized by resistor 32. Thus, the voltage level shifting circuit 58 is realized by a diode-connected transistor 62. Typically, the voltage developed across resistor 32, when transistor 14 is rendered fully conductive, is approximately equal to −0.8 volts, i.e., it is equal to $V_{BE}$. Therefore, level shifting circuit 58 is realized by diode-connected transistor 62 which has a voltage developed thereacross of approximately 0.8 volts.

Figure 4:
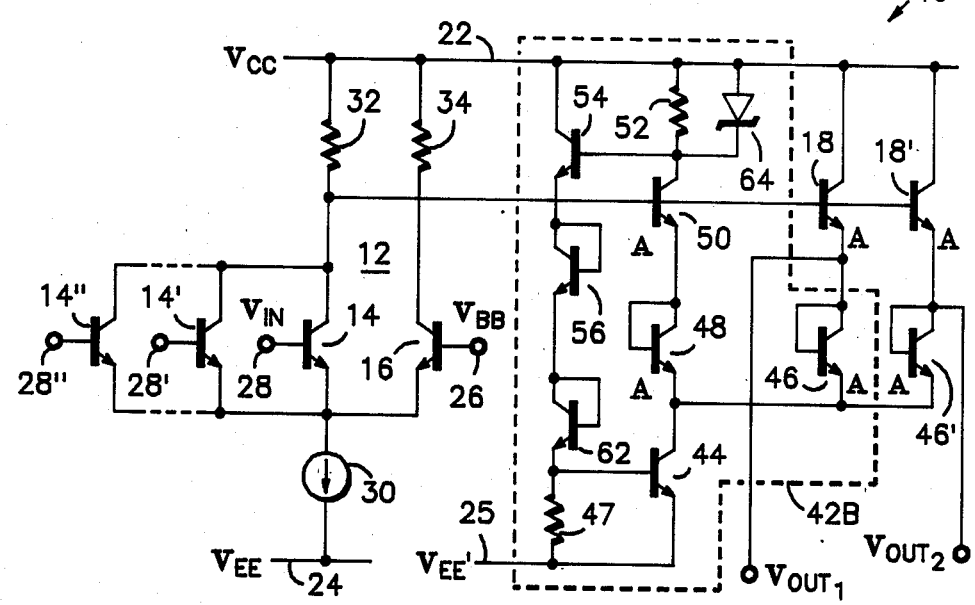
FIG. 4 is a schematic diagram illustrating another embodiment of the present invention.

Turning now to FIG. 4 there is shown another embodiment of the present invention where transient driver circuit 42b includes Schottky diode 64 coupled across resistor 52. In addition, ECL gate 40 is illustrated as being capable of supplying multiple outputs, $V_{OUT}$, and $V_{OUT2}$ by including an additional emitter follows transistor stage 18' and diode 46' connected identically with transistor 18 and diode 46.

The operation of ECL gate 40 of FIG. 4 is the same as described above with respect to FIGS. 2 and 3 except as transistor 50 is turned on the voltage drop at the collector of transistor 50 is limited to the forward voltage of Schottky diode 64. A well defined voltage is therefore established at the collector of transistor 50 by diode 64 which ensures that transistor 50 does not become saturated during the transient discharge state of operation or due to an increase in $V'_{EE}$.

It is understood that the diode-connected transistors of the preferred embodiment can be replaced by Schottky diodes although lower performance of circuit 40 may result. Further, diodes 56 and 62 of FIGS. 3 and 4 could be replaced by a resistor and capacitor connected in parallel and resistor 47 can be omitted.

Hence, what has been described above, is a novel transient driver circuit that can be utilized in conjunction with logic circuits to provide rapid charge and discharge of large capacitive loads connected to the output of the logic circuits.

We claim:

1. A circuit having an input at which is received an input switching signal and an output comprising:
   a first NPN transistor the collector of which is coupled to the output and the emitter of which is coupled to a first power supply connector at which is supplied a first potential;
   a second NPN transistor having an emitter coupled to said collector of said first transistor, a collector coupled to a second power supply conductor at which is supplied a second potential and a base which is coupled to the input of the circuit, said second NPN transistor tending to be turned off in response to the applied switching signal switching from a first level state to a second level state;
   an emitter follower stage coupled between the input of the circuit and the output thereof; and
   feedback circuit means having an input coupled to said collector of said second NPN transistor and being responsive to said second NPN transistor being turned off for providing sufficient base current drive to said first NPN transistor to rapidly cause said first NPN transistor to be turned on wherein a large transient current is sourced through said first NPN transistor from the output of the circuit.

2. A circuit having an input at which is received an input switching signal and an output, comprising:
   a first NPN transistor having an emitter, base and collector, said emitter of which is coupled to a first power supply conductor to which is supplied a first potential;
   a second NPN transistor having an emitter, a collector coupled to a second power supply conductor to which is supplied a second potential and a base coupled to the input of the circuit, said second transistor tending to be turned off in response to the switching signal switching from a first level state to a second level state;
   first diode means connecting said collector of said first NPN transistor to the output of the circuit;
   second diode means coupled between said collector of said first NPN transistors and said emitter of said second transistor through which a quiescent operating current is supplied to said first NPN transistor;
   an emitter follower stage coupled between the input of the circuit and the output thereof; and
   feedback circuit means having an input coupled to said collector of said second NPN transistor and being responsive to said second NPN transistor turning off for providing sufficient base current drive to said first NPN transistor to rapidly turn on said first NPN transistor wherein a large transient current is sourced through said first NPN transistor from the output of the circuit.

3. The circuit of claim 2 wherein said feedback circuit means includes:
   a third NPN transistor having a base that is coupled to said collector of said second NPN transistor, a collector coupled to said second power supply conductor; and
   voltage level shift means coupled between the emitter of said third NPN transistor and said base of said first NPN transistor, said voltage level shift means aiding in inhibiting said first NPN transistor from becoming saturated.

4. The circuit of claim 3 wherein said voltage level shift means includes third and fourth diode means coupled in series between said emitter of said third NPN transistor and said base of said first NPN transistor.

5. The circuit of claim 4 wherein said feedback circuit means further includes:
   a resistor coupled between said base of said first NPN transistor and said first power supply conductor; and
   circuit means coupled between said collector of said second NPN transistor and said second power supply conductor.

6. The circuit of claim 5 wherein said circuit means includes an additional resistor.

7. The circuit of claim 6 wherein said circuit means further includes a Schottky diode coupled across said additional resistor.

8. The circuit of claim 7 wherein said first, second and third diode means are diode connected NPN transistors.

9. An emitter-coupled-logic (ECL) gate including input switching circuitry responsive to an applied switching signal for establishing a voltage at a circuit node the value of which switches between first and second levels and an emitter-follower output stage connected to the circuit node for sourcing current to an output of the ECL gate to which a load is to be connected, the improvement including a transient driver circuit for sinking current from the output of the ECL gate during transient switching conditions when the emitter-follower stage turns off in response to the voltage at the circuit node switching to the second level from the first level, comprising:
- a first NPN transistor the collector of which is coupled to the output of the ECL gate and the emitter of which is coupled to a first power supply conductor;
- a second NPN transistor having an emitter coupled to the collector of the first NPN transistor, a collector coupled to a second power supply conductor and a base which is coupled to the circuit node, said second NPN transistor and said emitter-follower output stage providing a quiescent current to said first NPN transistor, said second NPN transistor being turned off in response to the voltage at the circuit node switching from the first level to the second level; and
- feedback means coupled to said collector of said second NPN transistor and being responsive to said second NPN transistor being turned off for providing sufficient base current drive to said first NPN transistor to rapidly cause said first NPN transistor to be turned on to sink a transient current having a magnitude greater than said quiescent current which flows through said first NPN transistor.

10. An emitter-coupled-logic (ECL) gate including input switching circuitry responsive to an applied switching signal for establishing a voltage at a circuit node the value of which switches between first and second levels and an emitter follower output stage connected to the circuit node for sourcing current to an output of the ECL gate, the improvement including a transient driver circuit for sinking current from the output of the ECL gate during transient switching conditions when the emitter-follower stage turns off, comprising:
- a first NPN transistor having an emitter, base and collector, said emitter being coupled to a first power supply conductor;
- first diode means connecting said collector of said first NPN transistor to the output of the circuit;
- a second NPN transistor having an emitter, a collector coupled to a second power supply conductor and a base which is coupled to the circuit node, said second NPN transistor and said emitter-follower stage supplying a quiescent current to said first NPN transistor;
- second diode means coupled between said collector of said first NPN transistor and said emitter of said second NPN transistor; and
- feedback means coupled to said collector of said second NPN transistor which is responsive to said second NPN transistor being turned off as said voltage at said circuit node switches to the second level for providing sufficient base current drive to said first NPN transistor to cause said first NPN transistor to rapidly turn on to sink a transient current having a magnitude which is greater than said quiescent current flowing therethrough.

11. The circuit of claim 10 wherein said feedback means includes:
- a third NPN transistor having a base that is coupled to said collector of said second NPN transistor, a collector coupled to said second power supply conductor; and
- voltage level shift means coupled between the emitter of said third NPN transistor and said base of said first NPN transistor, said voltage level shift means aiding in inhibiting said first NPN transistor from becoming saturated.

12. The circuit of claim 11 wherein said voltage level shift means includes third and fourth diode means coupled in series between said emitter of said third NPN transistor and said base of said first NPN transistor.

13. The circuit of claim 12 wherein said feedback means further includes:
- a resistor coupled between said base of said first NPN transistor and said first power supply conductor; and
- circuit means coupled between said collector of said second NPN transistor and said second power supply conductor.

14. The circuit of claim 13 wherein said circuit means includes an additional resistor.

15. The circuit of claim 14 wherein said circuit means further includes a Schottky diode coupled across said additional resistor.

16. The circuit of claim 15 wherein said first, second and third diode means are diode connected NPN transistors.

17. A circuit responsive to a logic signal applied thereto for sinking a transient current at an output, the logic signal having first and second level states, comprising:
- first and second power supply conductors;
- first circuit means responsive to the logic signal being in the first level state and having a predetermined voltage-current characteristic wherein a predetermined voltage drop is developed thereacross, said first circuit means being coupled between a circuit node and said first power supply conductor;
- a first NPN transistor, the collector-emitter path being coupled in series between the output of the circuit and said second power supply conductor;
- a second NPN transistor, the collector-emitter path being coupled in series between said first power supply conductor and the collector of said first NPN transistor, the base thereof being coupled to said circuit node; and
- feedback means coupled to the collector of said second NPN transistor and responsive to the voltage at the collector of said second NPN transistor rising in response to the logic signal switching from the second level state to the first level state for providing feedback current drive to the base of said first NPN transistor whereby said first NPN transistor is turned on to sink the transient current, the magnitude of which is greater than the quiescent current flowing through said first NPN transistor.

18. A circuit responsive to a logic signal applied thereto for sinking a transient current at an output, the logic signal having first and second level states, comprising:

first and second power supply conductors;

first circuit means responsive to the logic signal being in the first level state and having a predetermined voltage-current characteristic wherein a predetermined voltage drop is developed thereacross, said first circuit means being coupled between a circuit node and said first power supply conductor;

a first NPN transistor, the collector-emitter path being coupled in series between the output of the circuit and said second power supply conductor;

a second NPN transistor, the collector-emitter path being coupled in series between said first power supply conductor and the collector of said first NPN transistor, the base thereof being coupled to said circuit node;

feedback means coupled to the collector of said second NPN transistor and responsive to the voltage at the collector of said second NPN transistor rising in response to the logic signal switching from the second level state to the first level state for providing feedback current drive to the base of said first NPN transistor whereby said first NPN transistor is turned on to sink the transient current, the magnitude of which is greater than the quiescent current flowing through said first NPN transistor;

a third NPN transistor the base of which is connected to the collector of said second NPN transistor and the collector of which is connected to said first power supply conductor; and voltage shift means for shifting the voltage level between the base of said first NPN transistor and the emitter of said third NPN transistor.

19. The circuit of claim 18 wherein said voltage shift means includes:

first diode means; and a voltage level shift circuit coupled in series with said first diode means between said emitter and base respectively of said third and first NPN transistors and having substantially the same voltage characteristic as said first circuit means such that the same voltage drop occurs thereacross.

20. The circuit of claim 19 including:

second diode means coupled between the emitter of said second NPN transistor and said collector of said first NPN transistor; and third diode means coupled between the output of the circuit and said collector of said first NPN transistor.

* * * * *